US011696068B2

(12) United States Patent
Balgemann et al.

(10) Patent No.: US 11,696,068 B2
(45) Date of Patent: Jul. 4, 2023

(54) MICROPHONE WITH ADJUSTABLE SIGNAL PROCESSING

(71) Applicant: Shure Acquisition Holdings, Inc., Niles, IL (US)

(72) Inventors: Timothy William Balgemann, Lombard, IL (US); Soren Christian Pedersen, Chicago, IL (US); James Michael Pessin, Forest Park, IL (US); Brent Robert Shumard, Mount Prospect, IL (US); Lena Lins Sutter, Eau Claire, WI (US); Ryan Jerold Perkofski, Lake Bluff, IL (US)

(73) Assignee: Shure Acquisition Holdings, Inc., Niles, IL (US)

( * ) Notice: Subject to any disclaimer, the term of this patent is extended or adjusted under 35 U.S.C. 154(b) by 0 days.

(21) Appl. No.: 17/038,687

(22) Filed: Sep. 30, 2020

(65) Prior Publication Data
US 2021/0160611 A1 May 27, 2021

Related U.S. Application Data

(60) Provisional application No. 62/939,347, filed on Nov. 22, 2019.

(51) Int. Cl.
*H04R 1/32* (2006.01)
*H04R 1/20* (2006.01)
(Continued)

(52) U.S. Cl.
CPC .......... *H04R 1/326* (2013.01); *G10L 21/0216* (2013.01); *G10L 21/0264* (2013.01);
(Continued)

(58) Field of Classification Search
CPC ...... H04R 1/326; H04R 2420/09; H04R 1/20; H04R 2201/107; H04R 2420/07;
(Continued)

(56) References Cited

U.S. PATENT DOCUMENTS

| 8,392,180 | B1* | 3/2013 | Lachapelle | ............. G10L 21/02 704/278 |
| 2001/0015123 | A1* | 8/2001 | Nishitani | ........... A63B 71/0686 84/615 |

(Continued)

FOREIGN PATENT DOCUMENTS

| CN | 209170600 U | * | 7/2019 | |
| GB | 2488182 A | * | 8/2012 | ............. H03G 7/004 |

(Continued)

OTHER PUBLICATIONS

Shure, MV5 Condenser Microphone (Year: 2019).*
(Continued)

*Primary Examiner* — Matthew A Eason
*Assistant Examiner* — Kuassi A Ganmavo
(74) *Attorney, Agent, or Firm* — Banner & Witcoff, Ltd.

(57) ABSTRACT

A microphone may comprise a microphone element for detecting sound, and a digital signal processor configured to process a first audio signal that is based on the sound in accordance with a selected one of a plurality of digital signal processing (DSP) modes. Each of the DSP modes may be for processing the first audio signal in a different way. For example, the DSP modes may account for distance of the person speaking (e.g., near versus far) and/or desired tone (e.g., darker, neutral, or bright tone). At least some of the modes may have, for example, an automatic level control setting to provide a more consistent volume as the user changes their distance from the microphone or changes their speaking level, and that may be associated with particular (Continued)

default (and/or adjustable) values of the parameters attack, hold, decay, maximum gain, and/or target gain, each depending upon which DSP is being applied.

19 Claims, 11 Drawing Sheets

(51) Int. Cl.
*G10L 21/0216* (2013.01)
*H03G 3/30* (2006.01)
*H03G 3/32* (2006.01)
*G10L 21/0264* (2013.01)
*H04M 1/60* (2006.01)
*G10L 25/03* (2013.01)

(52) U.S. Cl.
CPC ............ *G10L 25/03* (2013.01); *H03G 3/3089* (2013.01); *H03G 3/32* (2013.01); *H04M 1/6066* (2013.01); *H04M 2250/02* (2013.01); *H04R 1/20* (2013.01); *H04R 2201/107* (2013.01); *H04R 2420/07* (2013.01); *H04R 2420/09* (2013.01)

(58) Field of Classification Search
CPC .... H04R 2430/01; H03G 3/3089; H03G 3/32; G10L 21/0216; G10L 21/0264; G10L 25/03; G10L 2021/02166; H04M 1/6066; H04M 2250/02
See application file for complete search history.

(56) References Cited

U.S. PATENT DOCUMENTS

| | | | | |
|---|---|---|---|---|
| 2003/0044028 | A1* | 3/2003 | Cranfill | H03G 3/301 381/104 |
| 2006/0210096 | A1* | 9/2006 | Stokes | H03G 3/3089 381/104 |
| 2007/0003078 | A1* | 1/2007 | Escott | H03G 7/007 381/107 |
| 2008/0269926 | A1* | 10/2008 | Xiang | H03G 7/007 381/94.2 |
| 2009/0252347 | A1* | 10/2009 | Kakkeri | H03G 3/3026 381/107 |
| 2009/0276721 | A1* | 11/2009 | Brockbank | G06F 3/165 715/764 |
| 2009/0304196 | A1* | 12/2009 | Patton | H04R 3/04 381/103 |
| 2010/0057475 | A1 | 3/2010 | Sollenberger et al. | |
| 2011/0103617 | A1* | 5/2011 | Shin | H03G 3/32 381/107 |
| 2011/0135118 | A1 | 6/2011 | Osborne | |
| 2012/0063613 | A1* | 3/2012 | Sato | H04R 3/005 381/92 |
| 2013/0093500 | A1* | 4/2013 | Bruwer | H03K 17/9622 327/517 |
| 2013/0121504 | A1* | 5/2013 | Adams | H04R 3/005 381/92 |
| 2014/0044268 | A1* | 2/2014 | Herberger | H04R 29/00 381/104 |
| 2014/0370855 | A1* | 12/2014 | Koss | H04M 3/53366 455/413 |
| 2015/0110263 | A1* | 4/2015 | Johnston | H04R 1/1041 379/430 |
| 2017/0222829 | A1 | 8/2017 | Kessler et al. | |
| 2018/0277133 | A1* | 9/2018 | Deetz | G10L 21/0364 |
| 2019/0159001 | A1* | 5/2019 | Wang | H04W 4/80 |
| 2019/0238244 | A1* | 8/2019 | Thramann | H04H 20/26 |

FOREIGN PATENT DOCUMENTS

| | | | |
|---|---|---|---|
| JP | 2005039531 A | * 2/2005 | |
| JP | 2007325141 A | * 12/2007 | |
| WO | WO-2020078237 A1 | * 4/2020 | ............... H04R 3/04 |

OTHER PUBLICATIONS

Shure, Model M26V Audio Level Controller, (Year: 1976).*
Dec. 7, 2020—(WO) Invitation to Pay Additional Fees—App PCT/US2020/053485.
Feb. 1, 20211—(WO) International Search Report and Written Opinion—App PCT/US2020/053485.
Shure MV51 User Guide, Apr. 13, 2019, printed from web.archive. org.
Model M62V Audio Level Controller Data Sheet, SHURE Microphones and Electronic components, 1976, 6 pages.

* cited by examiner

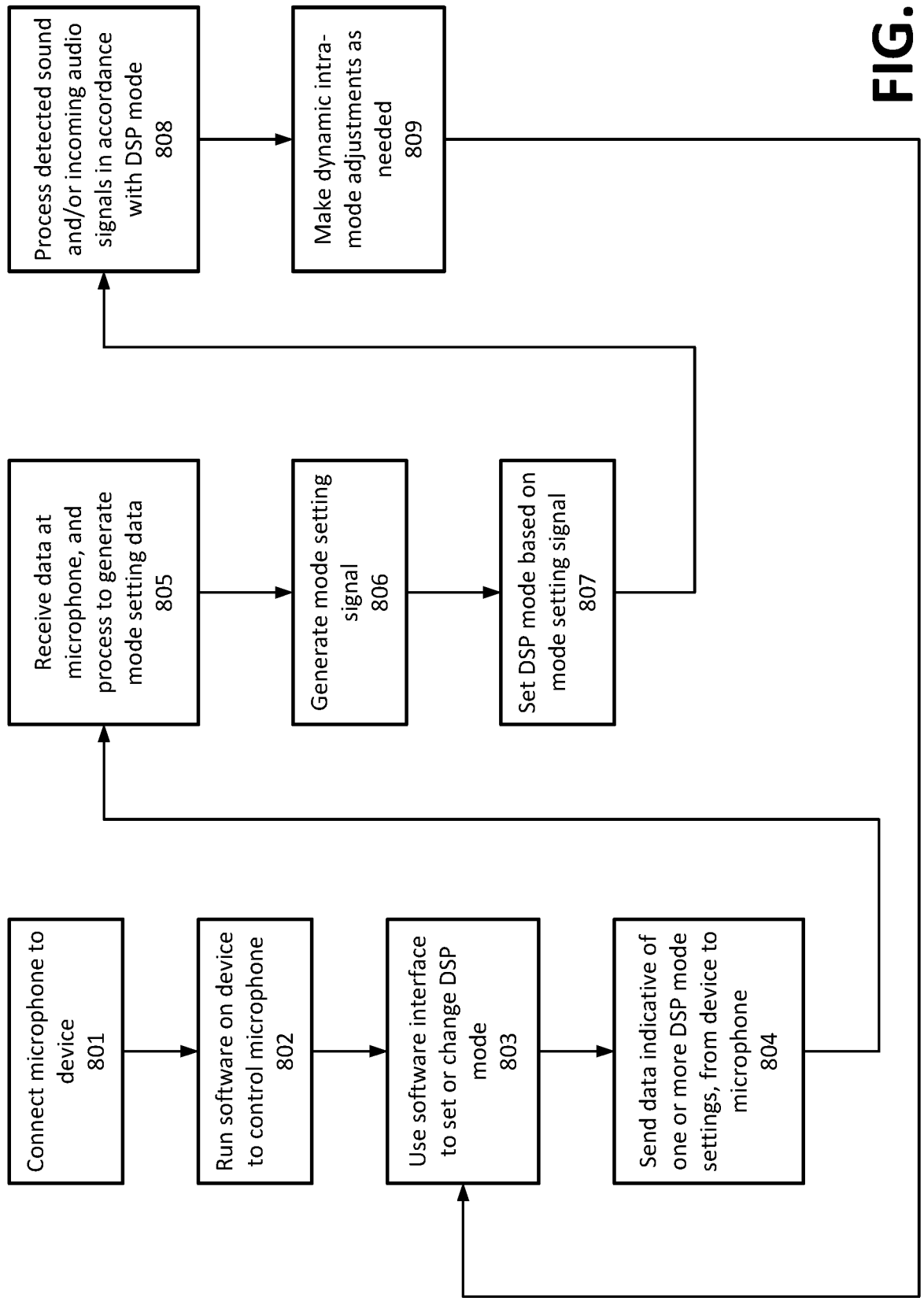

MICROPHONE WITH ADJUSTABLE SIGNAL PROCESSING

CROSS-REFERENCE TO RELATED APPLICATIONS

The present application claims priority to U.S. provisional patent application Ser. No. 62/939,347, which was filed Nov. 22, 2019, and entitled "Microphone With Adjustable Signal Processing," the entirety of which is hereby incorporated by reference.

BACKGROUND

Various types of microphones have certain advantages and limitations. For example, unidirectional (e.g., cardiod) dynamic microphones provide several advantages for speech recordings. These include rich low end and greater immunity to room noise. However, due to proximity effect and lower sensitivity, such microphones often require a user to have some knowledge of "good" microphone technique in order to get a consistent result.

In addition, while universal serial bus (USB) connected microphones are typically simple and convenient to use in a single-mic setup, it can be quite difficult, and sometimes even impossible, to use more than one microphone at a time together in the same setup.

SUMMARY

The following summary presents a simplified summary of certain features. The summary is not an extensive overview and is not intended to identify key or critical elements.

Examples of a microphone, and methods for operating and implementing the microphone, are described herein.

According to some aspects, the microphone may comprise any type of microphone, such as but not limited to a unidirectional microphone, a multidirectional microphone, an omnidirectional microphone, a dynamic microphone, a cardioid dynamic microphone, or a condenser microphone.

According to further aspects, the microphone may comprise multiple types of signal connectors, such as one or more universal serial bus (USB) connectors and/or one or more XLR connectors, which may be usable with a variety of other devices (e.g., Apple Mac computers and portable devices, Windows PC computers and portable devices, Android devices, XLR mixers and interfaces, etc.). The microphone connectors may comprise one or more digital signal connectors (e.g., USB) and/or one or more analog signal connectors (e.g., XLR). Each connector may be used as an input connector, as an output connector, or as both an input and an output connector. The user of the microphone may be able to conveniently use one or more of the connectors to expand the microphone to become part of a larger setup that uses multiple microphones. For example, the XLR connector of the microphone may be passive, and may be configured such that a user can daisy chain the output from an XLR connector of another microphone into an XLR connector of the microphone. In such an arrangement, the output from both microphones may be output through another connector of the microphone such as a USB connector.

According to further aspects, the circuitry providing output of audio via a USB connector may comprise a pre-amp and/or a digital signal processor (DSP) in the signal chain. The pre-amp and/or the DSP may be low-noise circuits.

According to further aspects, the DSP may process incoming audio in accordance with any of a plurality of modes. The plurality of modes may account for, e.g., distance of the person speaking (e.g., near versus far) and/or desired tone (e.g., darker, neutral, or bright tone). Some of the modes may be automatic modes, which may be tuned, for example, to accommodate different speech centric scenarios. More specifically, the automatic modes may be divided into, for example, a plurality of microphone position scenarios (for example, Close and Far position scenarios) and/or a plurality of tonal scenarios (for example, Dark, Neutral and Bright tonal scenarios). The user may manually set, or the DSP may automatically set, any combination of these two scenarios. Based on the selected combination of scenarios, the microphone DSP may adjust one or more of the settings to provide a desired output audio signal for various audio application, such as speech applications. The Close modes may include, for example, multiband compression and/or EQ settings intended to reduce the amount of proximity effect and sibilance. The Far modes may include, for example, multiband compression and/or EQ settings intended to increase low end and decrease thinness experienced when using a unidirectional microphone from distances greater than a predetermined distance (such as greater than twelve inches). Also, depending on the tonal scenario selected, the tonal adjustments may, for example, adjust Equalization to provide a user with a darker or brighter sound based on individual preference. In addition, the automatic modes may include automatic level control to provide a more consistent volume as the user changes their distance from the microphone or changes their speaking level.

According to further aspects, one or more others of the plurality of modes may be manual modes, which may allow a user to have manual control over one or more of the settings (although some of the settings may or may not still be automatically set).

According to further aspects, the DSP modes may be selected via a user interface on a device connected to the microphone, such as via a USB connector. The device may comprise, for example, a computing device such as a smart phone, tablet computer, personal computer, or the like. The device may present a user interface to the user, via which the user may select desired operational characteristics of the microphone such as a desired DSP mode or any other desired microphone setting.

According to further aspects, the microphone may itself comprise a user interface, and the user interface may comprise a capacitive-touch interface, which may be a curved capacitive-touch interface. This user interface may allow the user to manually select one or more microphone settings as desired.

According to further aspects, the microphone may be connected to a holder, such as a yoke that can be mounted in a desk mode and/or hanging studio mode. The holder may be, for example, U-shaped.

According to further aspects, a microphone may be provided that comprises a microphone element configured to detect sound. The microphone may further comprise a digital signal processor configured to process a first audio signal that is based on the sound in accordance with a selected one of a plurality of digital signal processing modes. Each of the plurality of digital signal processing modes may be for processing the first audio signal in a different way and for automatically adjusting one or more parameters to achieve a target gain or other target characteristic of the audio.

According to further aspects, a method may be performed that comprises generating a first audio signal based on sound detected by a microphone element of a microphone. The microphone may select, from a plurality of digital signal processing modes, a selected digital signal processing mode. Each of the plurality of digital signal processing modes may be for processing the first audio signal in a different way. The microphone may also automatically adjust one or more parameters of the digital signal processing mode being applied to achieve a target gain or other target characteristic of the audio. The microphone may further perform digital signal processing of the first audio signal in accordance with the selected digital signal processing mode. Such digital signal processing may further comprise automatically adjusting the gain based on the first audio signal. The microphone may also generate, as a result of the digital signal processing, a digital audio signal, and output the digital audio signal via a first connector of the microphone, such as a USB connector.

According to further aspects, a method may be performed that comprises receiving, by a first microphone, an audio signal from a second microphone or other device via a first connector such as an XLR connector. The first microphone may detect sound, such as using a microphone element. The microphone may further output, via a second connector such as a USB connector, a digital signal based on both the audio signal received via the first connector and the detected sound.

These and other features and potential advantages are described in greater detail below.

BRIEF DESCRIPTION OF THE DRAWINGS

Some features are shown by way of example, and not by limitation, in the accompanying drawings. In the drawings, like numerals reference similar elements.

FIG. 8 shows an example flow chart of a method that may be performed in accordance with aspects described herein.

DETAILED DESCRIPTION

Figure 1:
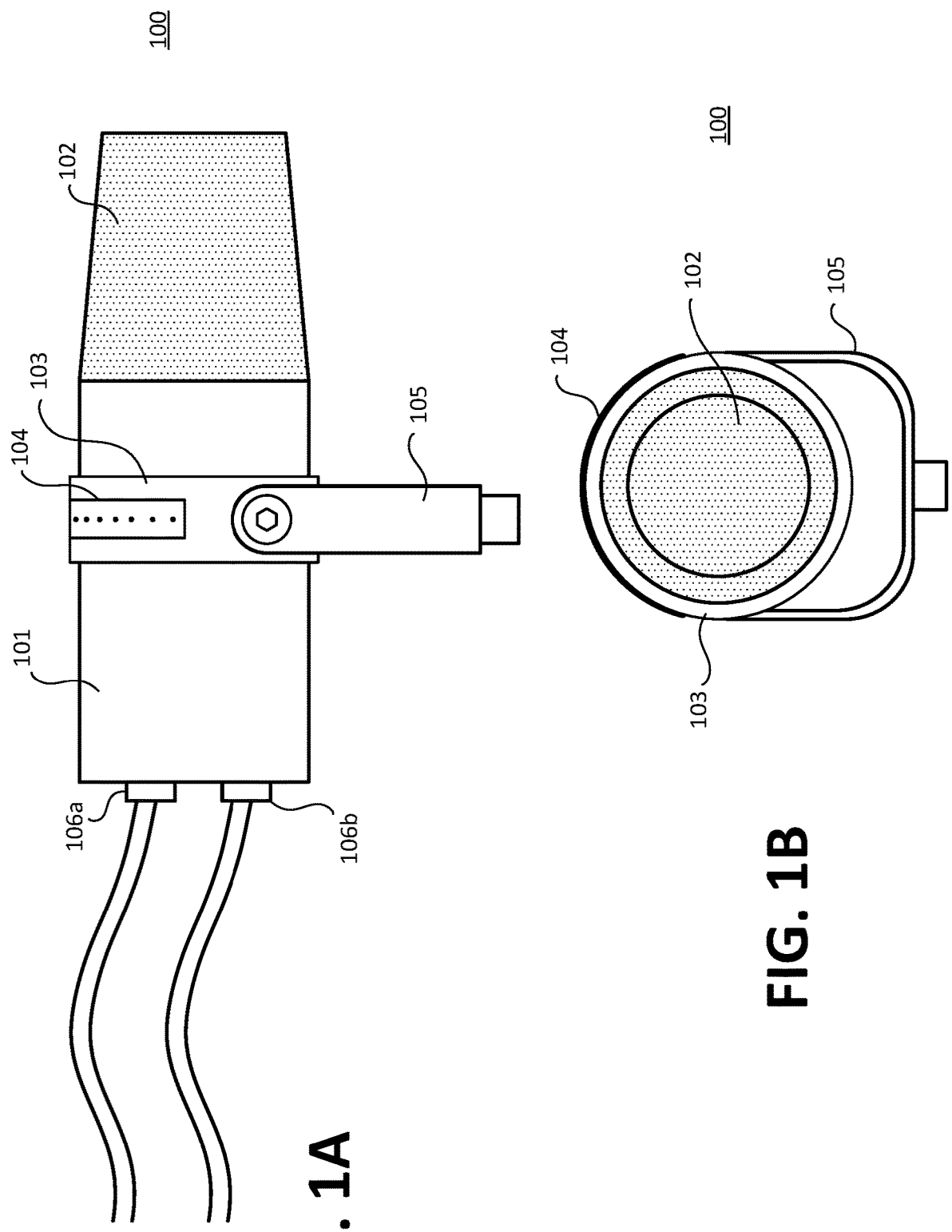
FIG. 1A shows a side view of an example microphone in accordance with aspects described herein.
FIG. 1B shows an example front view of the microphone of FIG. 1A.

The accompanying drawings, which form a part hereof, show examples of the disclosure. It is to be understood that the examples shown in the drawings and/or discussed herein are non-exclusive and that there are other examples of how the disclosure may be practiced.

FIGS. 1A and 1B show, respectively, a side view and a front view of an example microphone 100. The microphone 100 may include a body 101, which may house one or more other components of the microphone, such as any of the electronic circuitry described herein with regard to FIGS. 2, 3A, 3B, 4, 5, 6A, and/or 6B. The microphone 100 may further include a windscreen 102 covering a microphone element.

The body 101 may comprise a ring portion 103 or other portion, on and/or within which a user interface 104 may be disposed. The user interface 104 may comprise, for example, a capacitive-touch interface that the user may control via touch (e.g., by tapping and/or sliding the user's finger). The user interface 104 may have a shape that conforms to the outer shape of the portion of the body 101 on/within which the user interface 104 is disposed. For example, where the portion of the body 101 is curved, the user interface 104 may also be curved in the same way as the portion of the body 101.

The body 101 may be connected to (e.g., mounted on) a holder 105, such as a yoke. The holder may be used to mount the microphone to some other object, such as to a desk or a wall.

The body 101 may have one or more connectors, such as connectors 106a and 106b. The connectors (generically referred to herein as one or more connectors 106) may include, for example, one or more universal serial bus (USB) connectors, one or more XLR connectors, one or more power connectors, and/or any other type of data and/or power connectors suitable for transporting signals such as power, digital data (including digital audio signals), and/or analog audio signals to and from the circuitry of the microphone 100. In one particular example, connector 106a may be an XLR connector and connector 106b may be a USB connector.

Figure 2:
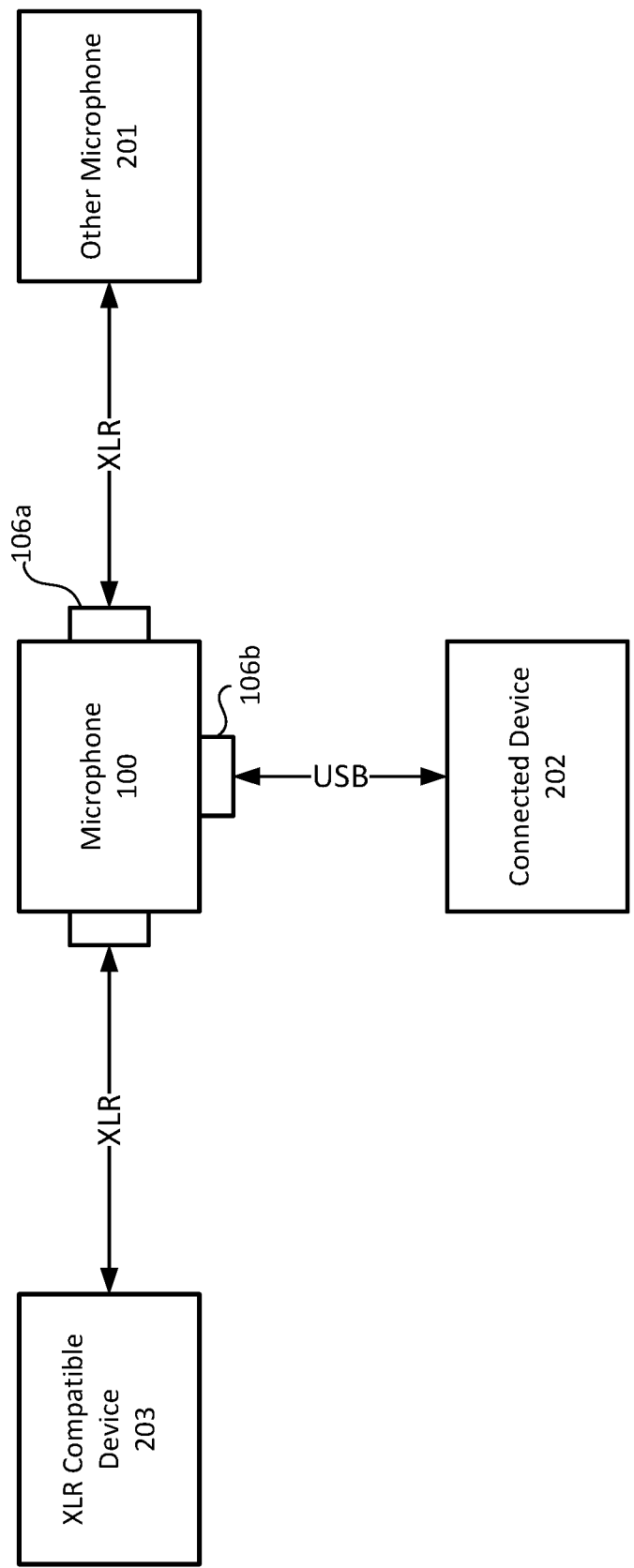
FIG. 2 shows a block diagram showing an example interconnection of a microphone, such as the microphone of FIGS. 1A and 1B, with one or more other devices, in accordance with aspects described herein.

FIG. 2 shows a block diagram showing an example interconnection of a microphone, such as the microphone 100, with one or more other devices, in accordance with aspects described herein. In this example, the microphone 100 is shown as connected with another XLR compatible microphone 201 via an XLR cable (such as via the connector 106a). The other microphone 201 may send audio signals, representative of sound detected by the other microphone 201, via the XLR cable to the microphone 100. The microphone 100 may process a combination of the audio signals on the XLR cable and audio signals representative of sound detected by a microphone element of the microphone 100. The microphone element may be any type of microphone element, such as a dynamic element or a condenser element.

The microphone 100 may also be connected, via a USB cable (such as via the connector 106b) to another device, in this example a connected device 202. The device 202 may be a computing device, such as a smart phone (e.g., an iPhone or Android phone), a tablet computer, a laptop computer, a desktop computer, a server, etc. As will be described later, the microphone 100 may comprise a digital signal processing system (DSP), and the device 202 may be used to control one or more settings of the microphone 100, including which mode the DSP is operating in, via signals transmitted on the USB cable connected between the device 202 and the microphone 100. In addition to transmitting settings information, the USB cable may also be used by the microphone 100 to transmit digital signals representative of audio. For example, the DSP of the microphone 100 may process both the audio signals received via the XLR cable from the other microphone 201 and audio signals resulting from the microphone element of the microphone 100 detecting sound. Digital signals resulting at least in part from the processing by the DSP may be sent to the device 202 via the USB cable. Thus, the XLR connector (which may be passive) of the microphone 100 (connected to the other microphone 201) may be configured such that a user can daisy chain the output from the XLR connector of the other microphone 201 into the XLR connector of the microphone 100. Accordingly, the user of the microphone may be able to conveniently use one or more of the connectors of the microphone 100 to expand the microphone 100 to become part of a larger setup that uses a plurality of microphones (in this example, microphones 100 and 201).

While a USB connection is discussed between the microphone 100 and the device 202, other types of wired or wireless connections may be used. For example, the connection between the microphone 100 and the device 202 may instead be a wireless connection, such as a WiFi connection, a BLUETOOTH connection, a near-field connection (NFC), and/or an infrared connection. Where the connection is wireless, the microphone 100 and the device 202 may include a wireless communications interface.

The microphone 100 may also be connected to one or more other devices, such as another XLR compatible device 203, via another connector such as another XLR connector. Examples of other XLR compatible devices may include yet another microphone, a mixer, an amplifier, a computing device, etc.

Figure 3:
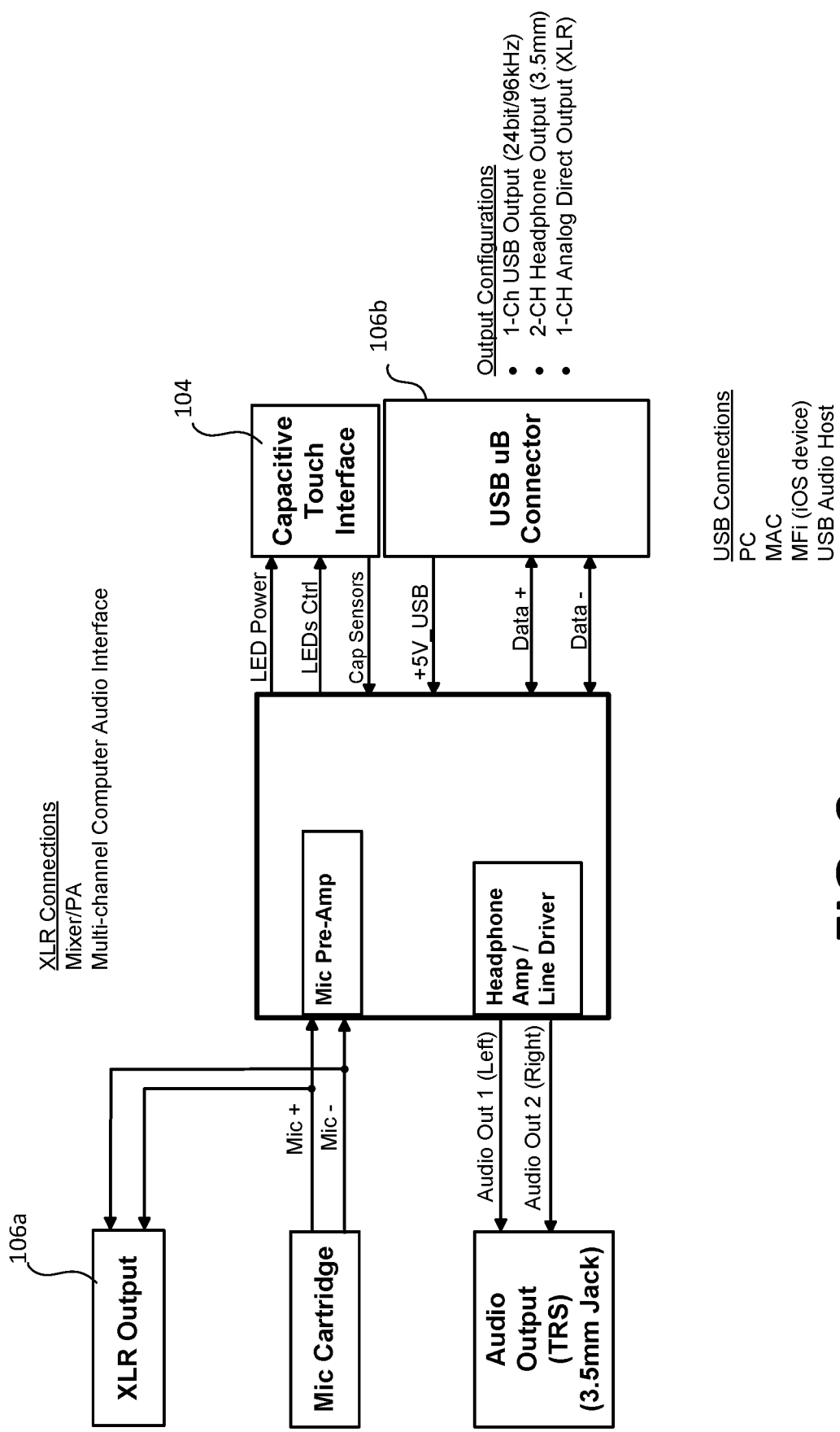
FIG. 3 shows an example block diagram of one or more portions of an example microphone, such as the microphone of FIGS. 1A and 1B, in accordance with aspects described herein.

FIG. 3 shows an example block diagram of one or more portions of an example microphone, such as the microphone 100. In the shown example, the microphone 100 may have one or more XLR connectors (labeled "XLR Output" in the figure; and which may be one or more of the previously-discussed connectors 106 such as the connector 106a), at least one microphone cartridge that may include one or more microphone elements, an audio output such as a 3.5 mm stereo audio jack connector, a microphone preamplifier, a headphone amplifier and/or line driver, a capacitive touch interface (which may be the previously-discussed user interface 104), and/or one or more USB connectors (which may be one of the previously-discussed connectors 106 such as the connector 106b), such as one or more USB micro B connectors or regular USB connectors. FIG. 3 also identifies, by way of example, several configurations of the XLR connections, several output configurations, and several USB connection types.

Figure 4A:
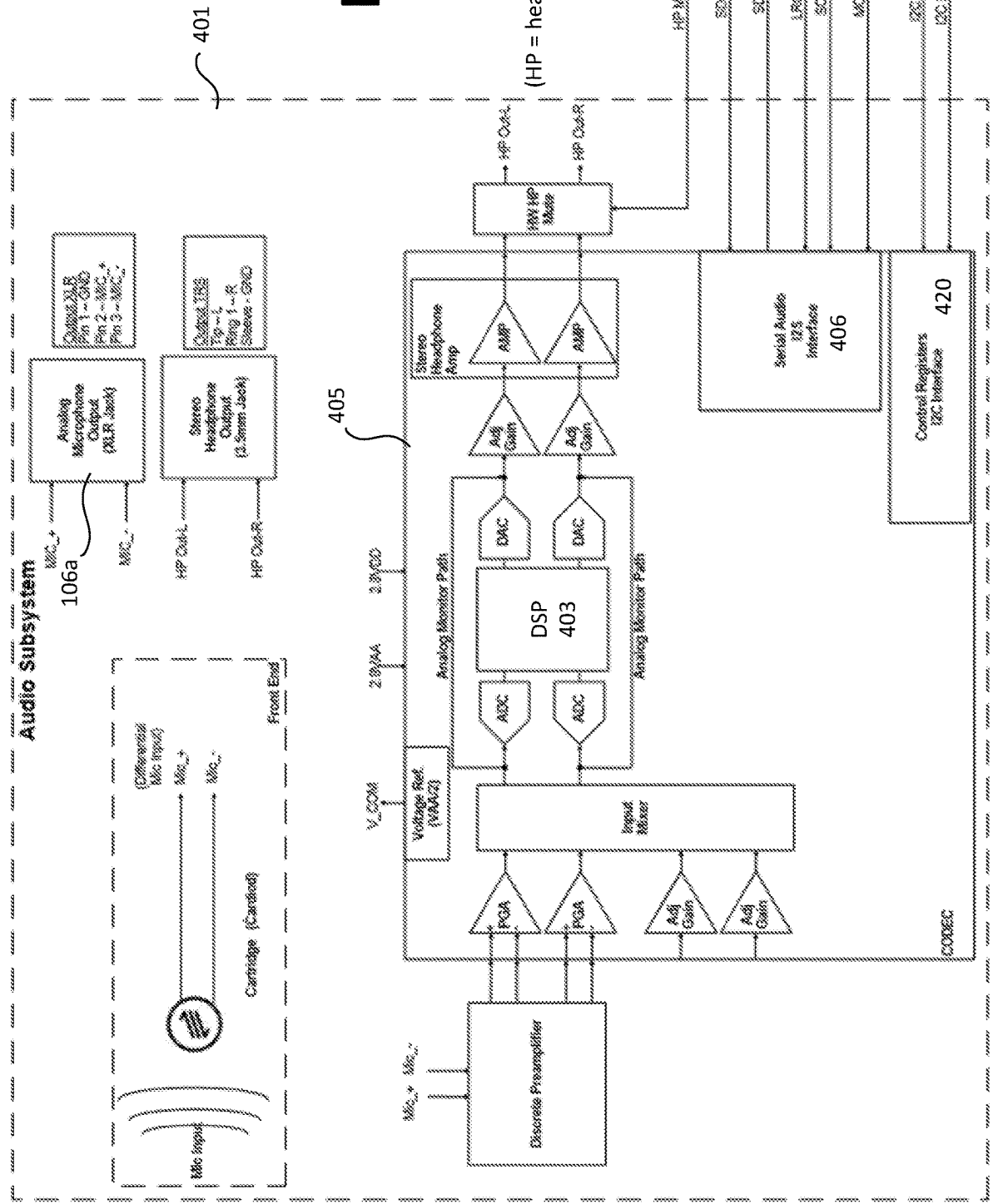
FIG. 4A shows another example block diagram of one or more portions of an example microphone, such as the microphone of FIGS. 1A and 1B, in accordance with aspects described herein.
Figure 4B:
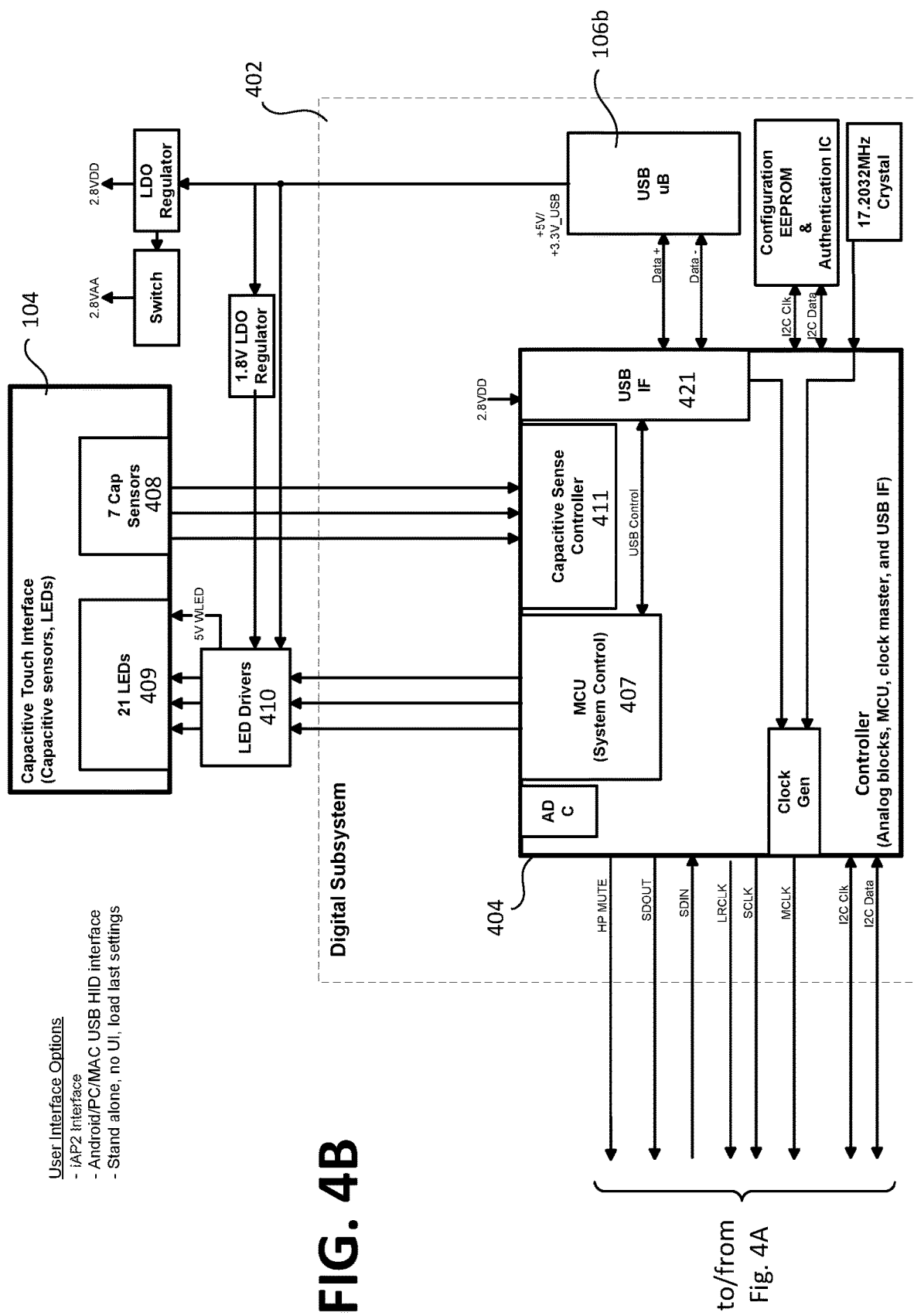
FIG. 4B shows another portion of the block diagram of FIG. 4A.

FIGS. 4A and 4B together show another example block diagram of one or more portions of an example microphone, such as the microphone 100. In the shown example, the microphone 100 may be considered to be logically divided into audio subsystem functionality (referred to herein as the "audio subsystem 401") and digital subsystem functionality (referred to herein as the "digital subsystem 402").

The audio subsystem 401 may be responsible for routing and processing audio and digital signals representing audio. The audio subsystem 401, which may physically share circuit components with the digital subsystem 402, may have a front end including the aforementioned microphone cartridge, the aforementioned one or more XLR connectors, the aforementioned audio jack (which may be stereo headphone jack), and the aforementioned microphone preamplifier.

The audio subsystem may further include circuitry such as amplifiers (e.g., adjustable gain amplifiers, input mixers, analog-to-digital converters (ADCs), digital-to-analog converters (DACs), control registers 420, data interfaces such as an I2C interface, audio interfaces such as a serial I2S interface 406, and a DSP 403, interconnected as shown in FIGS. 4A and 4B. As indicated in FIG. 4A, an audio path exists from the microphone cartridge and/or the XLR connector (as analog audio signals), through the input mixer, digitized by the ADCs to generate digital audio signals, through the DSP, through a set of amplifiers, and then ultimately provided as DSP-processed PCM digital audio data to be transmitted by a CODEC 405 via the serial audio I2S interface 406 to a controller 404 (FIG. 4B), which may be implemented as, for example, a system-on-chip (SoC). Digital audio and/or other data may be transmitted bidirectionally (from the CODEC 405 to the controller 404, and/or from the controller 404 to the CODEC 405) via the I2S connection. Any of the circuitry in FIGS. 4A and 4B may be implemented, for example, as a programmable gate array (PGA). Example amplifier components embodied by one or more PGAs are labeled "PGA" in FIG. 4A. Some or all of the above-mentioned circuitry may be embodied as part of a CODEC 405, which may be an integrated circuit device.

The CODEC 405 may contain adjustable gain stages and/or mixers for the audio inputs. For example, the indicated PGA-embodied amplifier components for the microphone inputs may have adjustable gain ("Adj Gain"), such as an adjustable gain of approximately 36 dB. The line inputs may also have adjustable gain, such as an adjustable gain of approximately 6 dB. The ADCs may be able to simultaneously accept, for example, dual microphone inputs, a combination of a microphone input and a line input, or dual line inputs (e.g., two channels in each of these situations). The indicated PGA-embodied amplifier components may have non-inverting inputs with variable impedance, so that the microphone 100 may be cross-connected to both PGAs with each leg seeing the same input impedance.

The digital subsystem 402 may interconnect with the analog audio subsystem 401 via one or more signaling lines, such as those shown interconnecting the circuitry of FIG. 4A with the circuitry of FIG. 4B. The digital subsystem 402 may be responsible for overall control of the microphone 100, and may include components such as one or more processors. The controller 404 may also embody the one or more PGAs discussed above and shown in FIG. 4A.

The controller 404 may have various signal inputs and outputs for communicating with other parts of the digital subsystem 402 and the analog subsystem 401, such as those inputs and outputs shown in the figures. For example, the digital audio signals provided by the audio subsystem 401 may be received by the controller 404 for further routing and/or processing, and the resulting processed and/or routed digital signals may then be passed from the controller 404 to the USB connectors 106b via a USB interface (labeled "USB IF" in the figures). Thus, the audio path in the audio subsystem 401 may further include the controller 404 and the USB connector 106b, ultimately carrying the resulting audio data via the paths labeled "Data +" and "Data −" between the controller 404 and the USB connector 106. These "Data +" and "Data −" lines connected with the USB connector 106b may also bi-directionally carry control signaling to and from the microphone 100 in addition to the aforementioned audio data. Controller 404 may be configured to implement both iAP and standard USB audio endpoints. The on-board MCU 407 may be used for system control and may link to iAP controls.

The controller 404 may also contain one or more processors (such as an MCU 407) for performing various functionality. The controller 404 may also store, in a non-transitory computer-readable storage medium (such as memory, which may be part of or connected to MCU 407), executable code (e.g., software) for performing various steps. When executed by the controller 404, or at least by the one or more processors thereof, the code may cause the controller 404 to perform the steps defined by the code.

As also shown in FIG. 4B, the user interface 104 may comprise a plurality of (e.g., seven) capacitive sensors 408 and/or a plurality of (e.g., 21) indicator lights (e.g., LEDs) 409 with corresponding drivers 410. The indicator lights (and/or other indicative markings) are shown by way of example as a series of black dots on the user interface 104 in FIG. 1A. The user interface, the capacitive sensors, and/or the indicator lights may be controlled by the MCU 407. The MCU 407 may be assisted with controlling the capacitive sensors by way of a controller, such as a capacitive sense controller 411.

Figure 5:
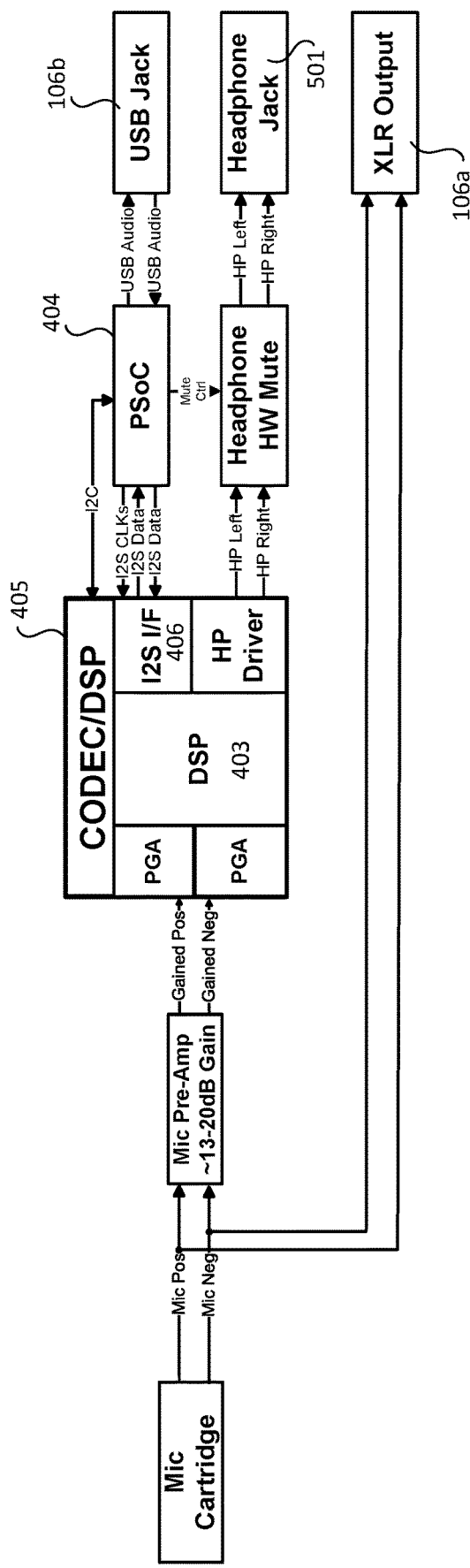
FIG. 5 shows another example block diagram of one or more portions of an example microphone (such as the microphone of FIGS. 1A and 1B), in accordance with aspects described herein.

FIG. 5 shows another example block diagram of one or more portions of an example microphone, such as the microphone 100. In this block diagram, an example audio output chain of the microphone 100 is shown, including both the analog output/input to/from the XLR connector 106a, analog output to a headphone (HP) jack 501, and the digital output to the USB connector 106b. FIG. 5 includes at least a portion of each of the audio subsystem 401 and the digital subsystem 402 shown from a different logical and functional point of view, specifically from the point of view of the audio subsystem 401.

Figure 7A:
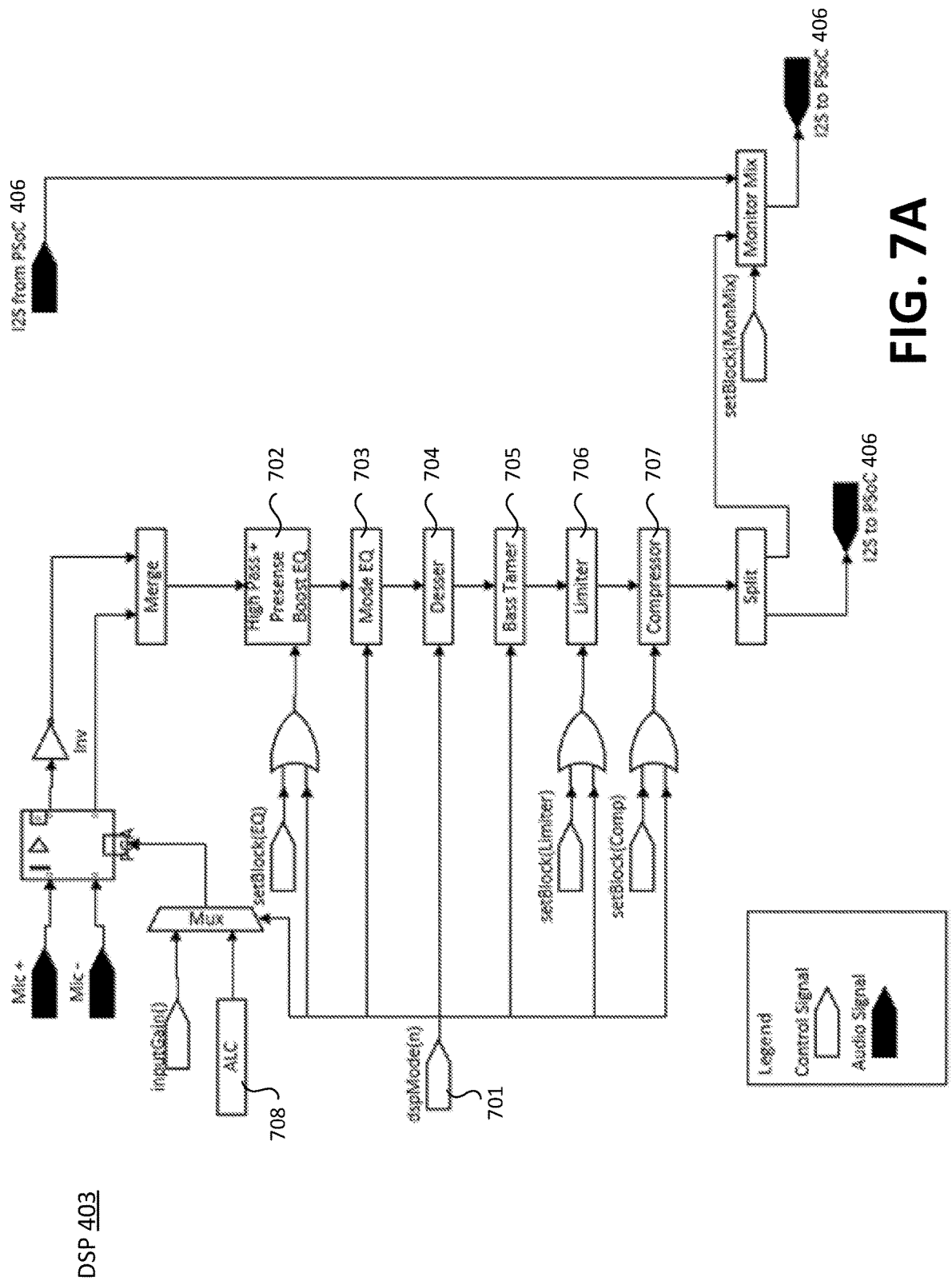
FIG. 7A shows another example block diagram of one or more portions of an example microphone (such as the microphone of FIGS. 1A and 1B) including at least a portion of a digital signal processing system (DSP), in accordance with aspects described herein.
Figure 7B:
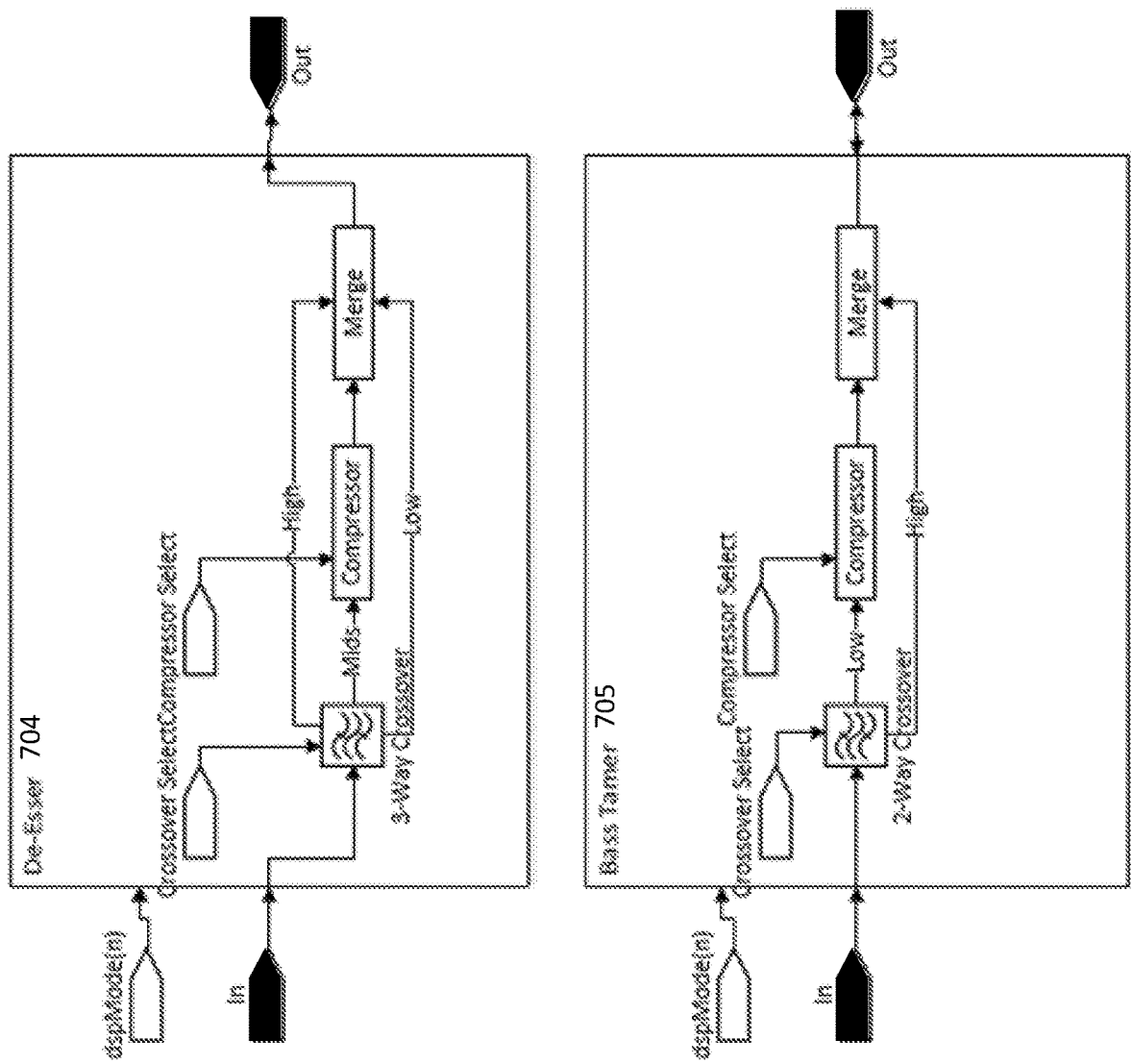
FIG. 7B shows a block diagram showing further example details of the de-esser and the bass tamer of FIG. 7A.

FIGS. 7A and 7B show another example block diagram of one or more portions of an example microphone (such as the microphone 100), including details of at least a portion of the DSP 403. The DSP 403 may include, for example, one or more modules for processing audio, including for example one or more equalizers such as a high pass/presence boost equalizer 702 and/or a mode equalizer 703, a de-esser 704, a bass equalizer such as a bass tamer (which may be used to reduce the proximity effect) 705, a limiter 706, a compressor 707, and/or an automatic level control (ALC) 708. Each of the modules 702-708 may be embodied, for example, as physical dedicated circuitry and/or as software executed by one or more processors such as a processor that is part of controller 404.

As discussed previously, the DSP 403 may operate in any of a plurality of modes. Each of the modes may be associated with a different combination or subcombination of settings of any or all of the modules 702-708. To set the modules 702-708 in accordance with a desired DSP mode setting, each of these modules 702-708 may be controlled to operate in various configurations in accordance with one or more signals including a mode setting signal 701, represented in FIG. 7A by "dspMode(n)" where n may be indicative of the dimension of mode setting signal 701. For example, the mode setting signal 701 and/or another signal may be presented in packets (e.g., bus packets) serially carrying n bits of data or n bytes of data, or be presented as n parallel conductive lines each carrying one or more bits or bytes of data. As one example, the mode setting signal 701 and/or another signal may represent a setting for each of the modules 702-708. For example, the mode setting signal 701 and/or another signal may indicate a particular setting for module 702, another particular setting for module 703, another particular setting for module 704, another particular setting for module 705, another particular setting for module 706, another particular setting for module 707, and/or another particular setting for module 708. Examples of such settings will be discussed further below.

Example detailed implementations of the de-esser 704 and the bass tamer 705 are shown in FIG. 7B.

FIG. 8 shows an example flow chart of a method that may be performed. Some of the steps may be performed by a microphone (such as the microphone 100), others of the steps may be performed by a device connected to the microphone (such as the device 202), and still others of the steps may be performed by a user of the device and/or of the microphone. While the method shows particular steps in a particular order, the method may be further subdivided into additional sub-steps, steps may be combined, and the steps may be performed in other orders without necessarily deviating from the concepts described herein.

Figure 9:
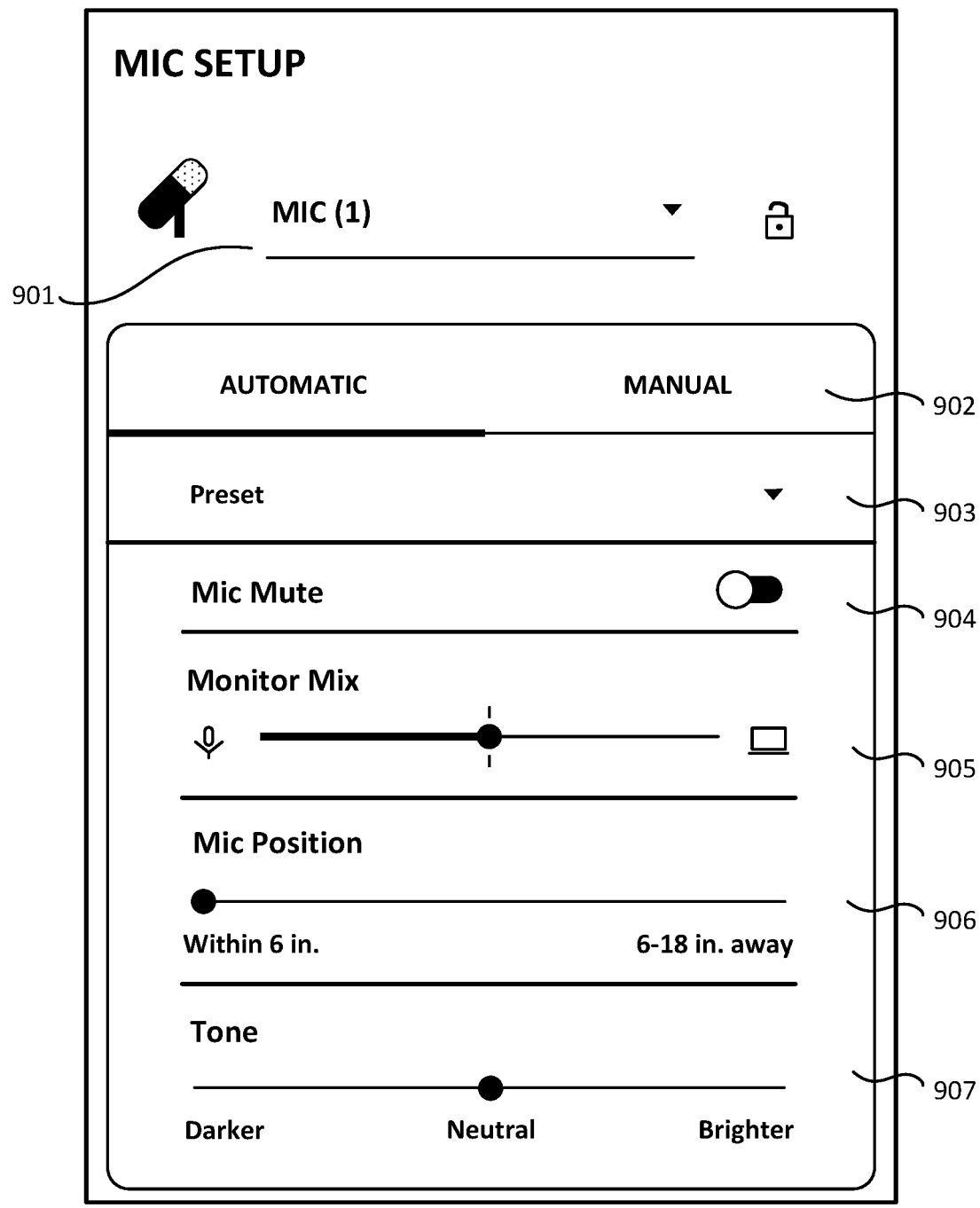
FIG. 9 shows an example user interface that may be displayed by a device connected to a microphone (such as the microphone of FIGS. 1A and 1B), in accordance with aspects described herein.

In operation, a user may connect the microphone 100 to the device 202, such as with a USB cable connected between a USB connector of the device 202 and the USB connector 106b of the microphone 100 (FIG. 8, step 801). The user may further run software (e.g., an app) on the device 202 that is configured to control one or more settings of the microphone 101 (step 802). For example, the software, when executed, may cause the device 202 to display a user interface that the user may interact with (e.g., via a touch screen, mouse, keyboard, etc.) to select a DSP mode that the microphone 100 should operate in (step 803). An example of such a user interface is shown in FIG. 9. In response to the user selection, the device 202 may send, via the USB cable, a control signal (such as data) indicative of one or more DSP mode settings in accordance with the user selection (step 804). This control signal may be received at the USB connector 106b of the microphone 100.

Next, the control signal at the USB connector 106b may be received by a USB interface (FIG. 4B) and then presented to the MCU 407 for processing. Based on the received USB control signal, the MCU 407 may generate mode setting data (step 805), which may be sent via the "I2C Data" connection identified in FIGS. 4A and 4B for storage by one or more of the control registers 420. This stored mode setting data may be retrieved and used as the mode setting signal 701 (step 806). The mode setting signal 701 may also include, or be supplemented by, other data such as "InputGain( )," "setBlock (Limiter)," and "setBlock (Comp)" as indicated in FIG. 7A, to set the DSP mode (step 807). Based on the mode setting signal 701 and/or such other signals, the DSP 403 may configure itself, including configuring some or all of modules 702-708, to processing sound detected by the microphone 100 and/or other audio signals (such as XLR audio signals received from the other microphone 201) (step 808). As will be described further below, each mode may have one or more settings that are adjustable within the mode, either manually by the user or automatically and dynamically by the DSP 403 itself without the need for manual intervention (step 809). If the user selects another DSP mode, then the process of FIG. 8 may return to step 803 for selection of the next DSP mode, and the remainder of the process may repeat as needed.

FIG. 9 shows an example user interface 900 that may be displayed by a device connected to the microphone, such as the device 202 connected to the microphone 100. The user interface 900 may be the user interface that the user interacts with for step 803. However, other user interfaces for selecting or otherwise setting the DSP mode may alternatively be used to implement step 803.

The user interface 900 may comprise a microphone selection portion 901, which may, for example, comprise a drop-down menu, and which may be used to select one or more microphones (e.g., microphone 100) connected to the device 202. The user interface 900 may also comprise an automatic/manual selection portion 902, which may be used to select between automatic DSP mode operation and manual DSP settings operation. In automatic DSP mode operation, the user may select from a plurality of offered predetermined DSP modes, and the DSP 403 may be configured in accordance with the selected DSP mode. In manual DSP settings operation, the user may manually configure each of a plurality of DSP settings.

The user interface 900 may further comprise a microphone mute switch 904, which may be used to selectively mute the sound being detected by the microphone 100. The user interface 900 may further comprise a monitor mix setting (such as a slider bar) 905, which may be used to select a mix, or ratio, of how much of the microphone 100 output audio signal (e.g., based on sound detected by the microphone cartridge and/or received via the XLR connector 106a from another microphone) is sent to the headphone jack 501 for real-time monitoring purposes. This may allow the user to hear audio in real time through the processing chain and into the headphones.

The user interface 900 may further comprise a microphone position setting (such as a slider bar) 906, which may be used to select an intended distance (or distance range) that the microphone 100 will be used at from the sound source (e.g., from the person speaking or singing into the microphone 100). While particular distances of "within 6 inches" and "6-18 inches away" are shown as potential settings, any other distances may be used as potential settings.

The user interface 900 may further comprise a tone setting (such as a slider bar) 907, which may be used to select amongst a plurality of tonal configurations such as darker tone, neutral tone, and/or brighter tone.

As previously discussed, the DSP 403 may be configured to operate in a plurality of DSP modes. The plurality of DSP modes may, for example, each be organized as a combination of a particular microphone distance (e.g., close, such as within six inches, versus far, such as 6-18 inches away) and a particular tone (e.g., darker versus neutral versus brighter). Given such an organization, the plurality of DSP modes may thus include, for example, the following six DSP modes: a Close-Neutral mode, a Close-Darker mode, a Close-Brighter mode, a Far-Neutral mode, a Far-Darker mode, and a Far-Brighter mode.

Based on the selected DSP mode, the DSP 403 may adjust one or more of the settings to provide a desired output audio signal for various audio application, such as speech applications. The Close modes (e.g., Close-Neutral, Close-Darker, Close-Brighter) may include, for example, multi-band compression and/or EQ settings intended to reduce the amount of proximity effect and sibilance. The Far modes (e.g., Far-Neutral, Far-Darker, Far-Brighter) may include, for example, multiband compression (using compressor module 707) and/or equalization (EQ) settings (using mode equalizer module 702) intended to increase low end and decrease thinness experienced when using a unidirectional microphone from distances greater than a predetermined distance (such as greater than twelve inches). Also, depending on the tonal scenario selected (e.g., neutral, darker, brighter), the tonal adjustments may, for example, adjust EQ to provide a user with a darker or brighter sound based on individual preference. In addition, the DSP modes may include Automatic Level Control (using module 708) to provide a more consistent volume as the user changes their distance from the microphone or changes their speaking level.

More specifically, each of the DSP modes may be associated with a different combination or subcombination of audio settings, some or all of which may be represented by the mode setting signal 701 and implemented by the DSP 403. Examples of audio settings that may be associated with DSP modes include settings for configuring any of the modules 702-708. The settings may include, for example, an Automatic Level Control setting, a De-esser setting, a Bass Tamer setting, a Limiter setting, and/or an Equalization setting. Each of these settings are discussed below.

Automatic Level Control (ALC) is a way of adjusting the gain of an amplifier based on the desired output signal level. By adjusting the input gain of the amplifier, the ALC module 708 provides a way to maintain a desirable (e.g., maximize) the signal to noise ratio of the audio output. The Automatic Level Control setting may be set to, for example, particular values of the parameters attack, hold, decay, maximum gain, and/or target gain, each depending upon which of the plurality of DSP modes is selected. Below is Table 1 summarizing such example settings for the ALC module 708.

TABLE 1

Automatic Level Control

| DSP Mode | Attack | Hold | Decay | Max Gain | Target Gain |
| --- | --- | --- | --- | --- | --- |
| Close-Neutral | A1 | H1 | D1 | MG1 | TG1 |
| Close-Darker | A2 | H2 | D2 | MG2 | TG2 |
| Close-Brighter | A3 | H3 | D3 | MG3 | TG3 |
| Far-Neutral | A4 | H4 | D4 | MG4 | TG4 |
| Far-Darker | A5 | H5 | D5 | MG5 | TG5 |
| Far-Brighter | A6 | H6 | D6 | MG6 | TG6 |

By way of example, values A1-A6 may in the range of about 10 to about 50 milliseconds, values H1-H6 may be in the range of about 1 to about 2 seconds, values D1-D6 may be in the range of about 500 to about 1000 milliseconds, values MG1-MG6 may be in the range of about +10 to about +20 decibels, and values TG1-TG6 may be in the range of about −5 to about −12 decibels, each depending upon which of the plurality of DSP modes is selected. The above-stated ranges of values are merely examples and are not intended to limit the possible values that may be used; the appropriate values would depend upon the particular characteristics of the microphone 100.

As previously discussed, some or each of the DSP modes may further be configured to dynamically and automatically adjust within the DSP mode (dynamic intra-mode adjustment) one or more parameters (e.g., any of the audio settings described herein) of the DSP mode over time. As an example, the Automatic Level Control setting may dynamically and automatically adjust, within a given DSP mode, any of the parameters Attack, Hold, and/or Decay, to automatically achieve the indicated Target Gain (e.g., any of TG1-TG6) associated with the given DSP mode and stay under the indicated maximum gain (e.g., any of MG1-MG6)

associated with the given DSP mode. Other parameters of the DSP mode may additionally or alternatively be adjusted to achieve the Target Gain and/or The maximum gain for Automatic Level Control may be at a higher level (e.g., higher decibel level) for the far DSP modes as compared with the near DSP modes. In addition, the Automatic Level Control setting may include a noise gate that is set to hold the gain constant when the input drops below a predetermined threshold (e.g., in the range of about −50 to about −60 decibels), to potentially reduce or even avoid excessive gaining up of the noise floor.

De-Essing is a technique used to reduce the amount of sibilant constants ('s', 'z', 'sh') in recordings. As shown in FIG. 7B, a multiband compressor may be used to realize the De-Esser module 704. The De-esser setting may be used to configured the de-esser module 704 and may be set to, for example, a particular ess band, and to particular values of the parameters attack, decay, ratio, and/or threshold at which de-essing is to be automatically performed, each depending upon which of the plurality of DSP modes is selected. The ratio parameter is a compression parameter that may determine how much compression is applied to the input audio signal after the threshold parameter is exceeded. Below is Table 2 summarizing such example settings for the De-Esser module 704.

TABLE 2

De-Esser

| DSP Mode | Ess Band | Attack | Decay | Ratio | Threshold |
|---|---|---|---|---|---|
| Close-Neutral | EB1 | A7 | D7 | R1 | T1 |
| Close-Darker | EB2 | A8 | D8 | R2 | T2 |
| Close-Brighter | EB3 | A9 | D9 | R3 | T3 |
| Far-Neutral | EB4 | A10 | D10 | R4 | T4 |
| Far-Darker | EB5 | A11 | D11 | R5 | T5 |
| Far-Brighter | EB6 | A12 | D12 | R6 | T6 |

By way of example, values EB1-EB6 may be particular frequencies in the range of about 3 to about 10 kilohertz, values A7-A12 may be in the range of about 3 to about 100 milliseconds, values D7-12 may be in the range of about 50 to about 100 milliseconds, values R1-R6 may be in the range of about 1 to about 2, and values T1-T6 may be in the range of about −40 to about −20 decibels. The above-stated ranges of values are merely examples and are not intended to limit the possible values that may be used; the appropriate values would depend upon the particular characteristics of the microphone 100.

Bass Taming is a technique used to dynamically reduce the amount of low frequency signals in a recording. As shown in FIG. 7B, the bass tamer module 705 may accomplish this using a multiband compressor that may aim to smooth out the increases in low frequencies when a user moves closer to a directional microphone (also known as the proximity effect). The Bass Tamer setting (which may be configure the bass tamer module 705) may be set to, for example, particular values of the parameters crossover, attack, hold, decay, ratio, and/or threshold at which bass taming is to be automatically performed. The ratio parameter may be a compression parameter that determines how much compression is applied to the input audio signal after the threshold parameter is exceeded. Below is Table 3 summarizing such example settings for the Bass Tamer module 705.

TABLE 3

Bass Tamer

| DSP Mode | Crossover | Attack | Hold | Decay | Ratio | Threshold |
|---|---|---|---|---|---|---|
| Close-Neutral | C1 | A13 | H7 | D7 | R7 | T7 |
| Close-Darker | C2 | A14 | H8 | D8 | R8 | T8 |
| Close-Brighter | C3 | A15 | H9 | D9 | R9 | T9 |
| Far-Neutral | C4 | A16 | H10 | D10 | R10 | T10 |
| Far-Darker | C5 | A17 | H11 | D11 | R11 | T11 |
| Far-Brighter | C6 | A18 | H12 | D12 | R12 | T12 |

By way of example, values C1-C6 may be in the range of about 100 to about 300 Hertz, or even disabled, values A13-A18 may be in the range of about 10 to about 100 milliseconds, values H7-H12 may be in the range of about 10 to about 40 milliseconds, values D7-D12 may be in the range of about 50 to about 1000 milliseconds, values R7-R12 may be in the range of about 2 to about 3, and values T7-T12 may be in the range of about −20 to about −35 decibels, each depending upon which of the plurality of DSP modes is selected. The above-stated ranges of values are merely examples and are not intended to limit the possible values that may be used; the appropriate values would depend upon the particular characteristics of the microphone 100.

The limiter module 706 may comprise a compressor used to prevent the audio signal from clipping. The Limiter setting (which may configure the limiter module 706) may be set to particular values of the parameters attack, hold, decay, and/or threshold at which limiting is to be automatically performed. Below is Table 4 summarizing such example settings for the Limiter module 706.

TABLE 4

Limiter

| DSP Mode | Attack | Hold | Decay | Threshold |
|---|---|---|---|---|
| Close-Neutral | A19 | H13 | D13 | T13 |
| Close-Darker | A20 | H14 | D14 | T14 |
| Close-Brighter | A21 | H15 | D15 | T15 |
| Far-Neutral | A22 | H16 | D16 | T16 |
| Far-Darker | A23 | H17 | D17 | T17 |
| Far-Brighter | A24 | H18 | D18 | T18 |

By way of example, values A19-A24 may be in the range of about 50 to about 100 milliseconds, values H13-H18 may be in the range of about zero to about 20 milliseconds, values D13-D18 may be in the range of about 500 to about 1000 milliseconds, and values T13-T18 may be in the range of about −2 to about −5 decibels, each depending upon which of the plurality of DSP modes is selected. In some examples, the values of attack, hold, decay, and threshold may be the same for all six of the above-listed DSP modes, and in other examples the values may differ amongst the six above-listed DSP modes. The above-stated ranges of values are merely examples and are not intended to limit the possible values that may be used; the appropriate values would depend upon the particular characteristics of the microphone 100.

Equalization is the selective increase or decrease of certain frequencies. The increase or decrease may be static or may be adjusted (usually relatively slowly) over time. To accomplish equalization, the Equalization setting may configure the mode equalizer module 703 and/or the HP Presence Boost EQ module 702 (the latter of which may emphasize the upper midband frequencies (for example, about 4 kHz to about 8 kHz) and may aid in intelligibility to set equalization parameters for one or more frequency bands. For example, a given DSP mode may be associated with one or more frequency bands to be equalized in a particular way. For each of the frequency bands for a given DSP mode, there may be a specified particular filtering type (e.g., high-pass filter, low shelf filter, or peaking filter), and specified particular values of boost/cut and/or Q parameters.

TABLE 5

Mode Equalization

| DSP Mode | Band | Boost/Cut | Frequency | Q | Type |
|---|---|---|---|---|---|
| Close-Neutral | B1 | BC1 | F1 | Q1 | T1 |
| Close-Darker | B2 | BC2 | F2 | Q2 | T2 |
| Close-Brighter | B3 | BC3 | F3 | Q3 | T3 |
| Far-Neutral | B4 | BC4 | F4 | Q4 | T4 |
| Far-Darker | B5 | BC5 | F5 | Q5 | T5 |
| Far-Brighter | B6 | BC6 | F6 | Q6 | T6 |

By way of example, values B1-B6 may be low frequencies such as in the range of 50-100 Hertz, or higher frequencies such as hundreds or even thousands of Hertz. Also by way of example, the values of T1-T6 may indicate filter shape such as high-pass filter, low shelf filter, or peaking filter. Also by way of example, values BC1-BC6 may be in the range of about −3 to about 3, and values Q1-Q6 may be in the range of about 0.5 to about 2. The above-stated ranges of values are merely examples and are not intended to limit the possible values that may be used; the appropriate values would depend upon the particular characteristics of the microphone 100.

Each of the above DSP modes may be selected by the user via the user interface of the control device 202, such as in the "Automatic" setting 902 of the user interface 900. However, the user may alternatively manually set (e.g., override, if previously automatically set) any or all of the above-discussed parameters using the "Manual" setting 902 of the user interface 900, which may present a user interface for allowing the user to manually set the values of any desired parameters for any of the modules 702-708. Additionally or alternatively, the user may be able to set the desired DSP mode and/or any of the above-discussed values directly on the microphone such as via the user interface 104.

Figure 6:
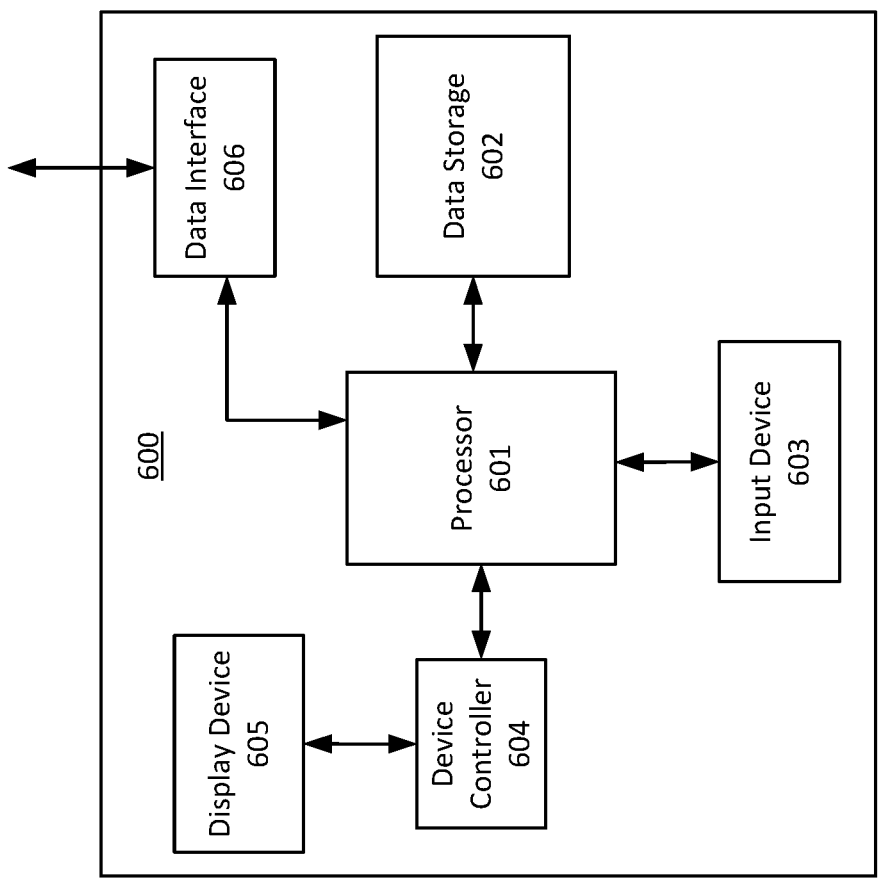
FIG. 6 shows a block diagram of an example computing device, in accordance with aspects described herein.

FIG. 6 shows a block diagram of an example computing device 600. The computing device 600 may be used to implement at least a portion of the device 202 and/or at least a portion of the microphone 100. For example, some or all of the controller 404, some or all of the MCU 407, some or all of the DSP 403, and/or some or all of any supporting circuitry thereof, may alternatively be implemented by the computing device 600. The computing device 600 may be any type of computing device, and may be physically implemented as a single unit or a system of multiple interacting units. For example, the computing device 600 may comprise one or more smart phones, one or more tablet computers, one or more laptop computer, one or more desktop computers, and/or one or more items of audio equipment that have computing functionality, etc. The box drawn around computing device 600 in FIG. 6 is not intended to limit the computing device 600 to a single physical unit (e.g., having a single physical housing).

In the shown example, the computing device 600 may comprise a processor 601, which may itself be physically implemented by one or more processors, such as one or more microprocessors, CPUs, MCUs, etc. The computing device 600 may further comprise data storage 602, which may be implemented as one or more computer-readable media, which may be non-transitory, such as one or more memories (e.g., RAM, ROM, FLASH, etc.), hard drives, removable drives, memory sticks, etc. The computing device 600 may further comprise an input device 603, such as a touch interface of a display, a mouse, a keyboard, a voice control device, etc. The computing device 600 may further comprise a device controller 604 for controlling an output device such as a display device 605. The display device 605 may be touch-sensitive, in which case the display device 605 may also serve as the input device 603. The computing device 600 may further comprise a data interface 606 for communicating with one or more devices external to the computing device 600. For example, the data interface 606 may comprise a USB interface, an XLR interface, and/or a wireless interface (e.g., WiFi, BLUETOOTH, NFC, infrared). As another example, the data interface 606 may implement the XLR interface of the other microphone 201, the USB interface of the device 202, the XLR interface of XLR compatible device 203, the USB interface 421 for the USB connector 106b, and/or the XLR interface for the XLR connector 106a.

The data storage 602 may store computer-executable instructions that, when executed by the processor 601, may cause the computing device 600 to perform various steps. For example, when executed by any processors of the microphone 100, the instructions may cause the microphone 100 to perform any or all of steps 805-809, and/or to perform any other functionality of the microphone 100. As another example, when executed by any processors of the device 202, the instructions may cause the device 202 to perform any or all of steps 802-804, and/or to perform any other functionality of the device 202.

The data storage 602 may also store other data. For example, where the data storage 602 is part of the device 202, the data storage 602 may store its operating system and/or the software application that performs steps 802-804, user preferences such as preferred DSP modes, a list of microphones (such as the microphone 100) previously setup with the software application, communication protocol settings, and/or data supporting any other functionality of the device 202. Where the data storage 602 is part of the microphone 100, the data storage 602 may, for example, embody the control registers 420 and/or may store any of the data used for selecting and configuring DSP modes, any other settings of the DSP 403, communication protocol settings, and/or data supporting any other functionality of the microphone 100.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The invention claimed is:

1. A microphone comprising:
   a microphone element configured to detect sound;
   a digital signal processor configured to process a first audio signal that is based on the sound in accordance with a selected one of a plurality of digital signal processing modes, wherein each of the plurality of digital signal processing modes is for processing the first audio signal in accordance with a different combination of a microphone position setting and a tone setting, and wherein the digital signal processor is configured to process the first audio signal in accordance with the selected one of the plurality of digital signal processing modes by at least:
  determining, based on the selected one of the plurality of digital signal processing modes, a value of an attack parameter, a value of a hold parameter, a value of a decay parameter, a value of a target gain parameter, and a value of a maximum gain parameter;
  applying, to the first audio signal, the value of the attack parameter, the value of the hold parameter, and the value of the decay parameter; and
  automatically adjusting the first audio signal based on the value of the target gain parameter and based on the value of the maximum gain parameter; and
a first connector configured to output a digital audio signal resulting from processing the first audio signal in accordance with the selected one of the plurality of digital signal processing modes.

2. The microphone of claim 1, wherein each of the plurality of digital signal processing modes is associated with a different setting comprising at least one of the following settings: an equalization setting, a de-essing setting, a bass setting, a limiter setting, or an audio compression setting.

3. The microphone of claim 1, wherein the microphone comprises a directional dynamic microphone.

4. The microphone of claim 1, further comprising a body that comprises a capacitive-touch interface configured to allow for manual adjustment of a plurality of settings of the microphone.

5. The microphone of claim 1, wherein the first connector comprises a universal serial bus (USB) connector.

6. The microphone of claim 1, wherein each of at least some of the plurality of digital signal processing modes is associated with a different value of the target gain parameter.

7. The microphone of claim 1, wherein the first connector is configured to receive a control signal, and wherein the digital signal processor is configured to select, based on the control signal, the selected one of the plurality of digital signal processing modes.

8. The microphone of claim 1, further comprising a second connector configured to receive an analog audio signal from another device, and wherein the microphone is configured to generate the first audio signal based on both the sound detected by the microphone element and the analog audio signal received via the second connector.

9. The microphone of claim 8, wherein the first connector comprises a universal serial bus (USB) connector and the second connector comprises an XLR connector.

10. A method comprising:
  generating a first audio signal based on sound detected by a microphone element of a microphone;
  selecting, from a plurality of digital signal processing modes, a selected digital signal processing mode, wherein each of the plurality of digital signal processing modes is for processing the first audio signal in accordance with a different combination of a microphone position and a tone setting;
  processing the first audio signal in accordance with the selected one of the plurality of digital signal processing modes by at least:
    determining, based on the selected one of the plurality of digital signal processing modes, a value of an attack parameter, a value of a hold parameter, a value of a decay parameter, a value of a target gain parameter, and a value of a maximum gain parameter;
    applying, to the first audio signal, the value of the attack parameter, the value of the hold parameter, and the value of the decay parameter; and
    automatically adjusting the first audio signal based on the value of the target gain parameter and based on the value of the maximum gain parameter;
  generating, by the microphone, a digital audio signal based on the processing of the first audio signal; and
  outputting the digital audio signal via a first connector of the microphone.

11. The method of claim 10, wherein each of the plurality of digital signal processing modes is associated with a plurality of settings for at least one of the following audio processing aspects: an equalization setting, a de-essing setting, a bass setting, a limiter setting, or an audio compression setting.

12. The method of claim 10, wherein the first connector comprises a universal serial bus (USB) connector.

13. The method of claim 10, further comprising receiving, via the first connector, a control signal, wherein the selecting comprises selecting the selected digital signal processing mode based on the control signal.

14. The method of claim 10, further comprising:
  receiving, via a second connector of the microphone, an analog audio signal from another device; and
  generating the first audio signal based on both the sound detected by the microphone element and the analog audio signal received via the second connector.

15. The method of claim 14, wherein the first connector comprises a universal serial bus (USB) connector and the second connector comprises an XLR connector.

16. A method comprising:
  receiving, by a first microphone, an analog audio signal from a second microphone via an XLR connector;
  detecting sound by the first microphone;
  generating, based on the analog audio signal received via the XLR connector and the sound detected by the first microphone, a first audio signal;
  selecting, from a plurality of digital signal processing modes, a selected digital signal processing mode;
  processing the first audio signal in accordance with the selected one of the plurality of digital signal processing modes to produce by at least:
    determining, based on the selected one of the plurality of digital signal processing modes, a value of a target gain parameter and at least one value of at least one other parameter;
    applying, to the first audio signal, the at least one value of the at least one other parameter; and
    adjusting the first audio signal based on the value of the target gain parameter; and
  outputting, via a universal serial bus (USB) connector, a digital signal the processing of the first audio signal.

17. The method of claim 16, wherein the selecting comprises selecting the selected digital signal processing mode based on a control signal received via the USB connector.

18. The method of claim 16, wherein the at least one other parameter comprises at least one of an attack parameter, a hold parameter, or a decay parameter.

19. The method of claim 16, wherein each of the plurality of digital signal processing modes comprises a different combination of a microphone position setting and a tone setting.

* * * * *

UNITED STATES PATENT AND TRADEMARK OFFICE
CERTIFICATE OF CORRECTION

PATENT NO. : 11,696,068 B2
APPLICATION NO. : 17/038687
DATED : July 4, 2023
INVENTOR(S) : Balgemann et al.

It is certified that error appears in the above-identified patent and that said Letters Patent is hereby corrected as shown below:

On the Title Page

Page 2, Column 2, Other Publications, Line 4:
Delete "Feb. 1, 20211" and insert --Feb. 11, 2021-- therefor In the Claims Column 16, Line 55:
In Claim 16, after "signal", insert --based on--

Signed and Sealed this
Twenty-third Day of April, 2024

Katherine Kelly Vidal
*Director of the United States Patent and Trademark Office*